United States Patent
Hosseini et al.

(10) Patent No.: US 9,054,040 B2
(45) Date of Patent: Jun. 9, 2015

(54) MULTI-DIE PACKAGE WITH SEPARATE INTER-DIE INTERCONNECTS

(71) Applicant: Infineon Technologies Austria AG, Villach (AT)

(72) Inventors: Khalil Hosseini, Weihmichl (DE); Joachim Mahler, Regensburg (DE); Josef Höglauer, Kirchheim (DE)

(73) Assignee: Infineon Technologies Austria AG, Villach (AT)

( * ) Notice: Subject to any disclaimer, the term of this patent is extended or adjusted under 35 U.S.C. 154(b) by 148 days.

(21) Appl. No.: 13/778,801

(22) Filed: Feb. 27, 2013

(65) Prior Publication Data

US 2014/0240945 A1    Aug. 28, 2014

(51) Int. Cl.
| | |
|---|---|
| *H05K 7/02* | (2006.01) |
| *H05K 7/06* | (2006.01) |
| *H05K 7/08* | (2006.01) |
| *H05K 7/10* | (2006.01) |
| *H01L 23/00* | (2006.01) |

(52) U.S. Cl.
CPC ............. *H01L 24/30* (2013.01); *H01L 24/83* (2013.01); *H01L 2924/13091* (2013.01); *H01L 2924/13062* (2013.01); *H01L 2924/1306* (2013.01); *H01L 2924/13055* (2013.01); *H01L 2924/1305* (2013.01)

(58) Field of Classification Search
USPC ......... 361/763–767, 782–784, 790–795, 813; 257/686–692, 720–730
See application file for complete search history.

(56) References Cited

U.S. PATENT DOCUMENTS

| | | | |
|---|---|---|---|
| 6,255,722 B1 * | 7/2001 | Ewer et al. .................... | 257/676 |
| 6,677,669 B2 | 1/2004 | Standing | |
| 6,946,740 B2 | 9/2005 | Schaffer | |
| 7,208,818 B2 | 4/2007 | Luo et al. | |
| 7,285,849 B2 | 10/2007 | Cruz et al. | |
| 7,800,208 B2 | 9/2010 | Otremba | |

(Continued)

FOREIGN PATENT DOCUMENTS

| | | |
|---|---|---|
| DE | 10301091 A1 | 7/2004 |
| DE | 102008027703 A1 | 1/2009 |
| DE | 102008051965 A1 | 7/2009 |

OTHER PUBLICATIONS

Author Unknown. "Complete Current Share 10A DC/DC Power Module." FN8271.4. Intersil Americas LLC. Mar. 7, 2013. pp. 1-24.

(Continued)

*Primary Examiner* — Tuan T Dinh
(74) *Attorney, Agent, or Firm* — Murphy, Bilak & Homiller, PLLC

(57) ABSTRACT

A first electrode at a first side of a first semiconductor die is connected to a first conductive region of a substrate. A first electrode at a first side of a second semiconductor die is connected to a second conductive region of the substrate. Each die has a second electrode at an opposing second side of the respective die. A first metal layer extends from a periphery region of the substrate to over the first die. The first metal layer has a generally rectangular cross-sectional area and connects one of the conductive regions in the periphery region of the substrate to the second electrode of the first die. A second metal layer separate from the first metal layer extends over the first and second dies. The second metal layer has a generally rectangular cross-sectional area and connects the second electrodes of the first and second dies.

21 Claims, 6 Drawing Sheets

(56) References Cited

U.S. PATENT DOCUMENTS

| | | |
|---|---|---|
| 7,804,131 B2 | 9/2010 | Cheah et al. |
| 7,851,908 B2 | 12/2010 | Otremba et al. |
| 7,944,044 B2 * | 5/2011 | Carney et al. ............... 257/706 |
| 8,193,618 B2 | 6/2012 | Madrid |
| 2008/0023825 A1 * | 1/2008 | Hebert et al. ............... 257/724 |
| 2008/0224323 A1 | 9/2008 | Otremba et al. |
| 2010/0148327 A1 | 6/2010 | Madrid |
| 2012/0292753 A1 | 11/2012 | Cho |
| 2012/0299119 A1 | 11/2012 | Xue et al. |

OTHER PUBLICATIONS

Author Unknown. "60A Integrated PowIRstage." IR3550, Final Datasheet. International Rectifier. Mar. 12, 2012. pp. 1-22.

Author Unknown. "High Performance DrMOS." TDA21220, Data Sheet Revision 1.9. Infineon Technologies AG. Mar. 31, 2012. pp. 1-26.

* cited by examiner

MULTI-DIE PACKAGE WITH SEPARATE INTER-DIE INTERCONNECTS

TECHNICAL FIELD

The instant application relates to multi-die packages, and more particularly to inter-die interconnections in multi-die packages.

BACKGROUND

Increases in integration density of electronic components and associated greater demand on thermal and electrical conductivities of the package require new connection technologies with better thermal and electrical conductivity, and also new construction technology for the corresponding connecting elements. In recent years, metal clips instead of wire bonds have been used to provide electrical connections between semiconductor die (chip) electrodes and a lead frame. The metal clips provide a large-area connection between lead frames and die electrodes, permitting an increase in the electrical and thermal properties of the package over wire bonds. However conventional metal clip interconnects have a major limitation in process performance, especially when multiple dies are used in a single package. A single metal clip is conventionally used to connect the electrodes of two or more dies to the same potential in one package. Due to different electrode topologies of encapsulated dies and other considerations, it is problematic to realize such a single-clip inter-die connection in a multi-die package. Conventional single-clip inter-die interconnects limit the design and placement of semiconductor dies within a housing, and do not allow for rotation of dies in an assembly particularly when the metal clips are large.

SUMMARY

According to an embodiment of a multi-die package, the multi-die package comprises a substrate having a plurality of conductive regions and a first semiconductor die having first and second opposing sides, a first electrode at the first side connected to a first one of the conductive regions, and a second electrode at the second side. The multi-die package further comprises a second semiconductor die having first and second opposing sides, a first electrode at the first side connected to a second one of the conductive regions, and a second electrode at the second side. A first metal layer extends from a periphery region of the substrate to over the first die. The first metal layer has a generally rectangular cross-sectional area and connects one of the conductive regions in the periphery region of the substrate to the second electrode of the first die. A second metal layer separate from the first metal layer extends over the first and second dies. The second metal layer has a generally rectangular cross-sectional area and connects the second electrode of the first die to the second electrode of the second die.

According to an embodiment of a method of manufacturing a multi-die package, the method comprises: providing a substrate having a plurality of conductive regions; connecting a first electrode at a first side of a first semiconductor die to a first one of the conductive regions, the first die having a second electrode at an opposing second side of the first die; connecting a first electrode at a first side of a second semiconductor die to a second one of the conductive regions, the second die having a second electrode at an opposing second side of the second die; connecting one of the conductive regions in a periphery region of the substrate to the second electrode of the first die via a first metal layer which extends from the periphery region of the substrate to over the first die and has a generally rectangular cross-sectional area; and connecting the second electrode of the first die to the second electrode of the second die via a second metal layer which is separate from the first metal layer, extends over the first and second dies and has a generally rectangular cross-sectional area.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

The embodiments described herein use a separate metal clip or other type of metal layer having a generally rectangular cross-sectional area for connecting the electrodes of two semiconductor dies to the same potential in one package, and additional metal clips or metal layers for connecting the dies to a lead frame or other type of substrate included in the package. The term 'metal layer' as used herein is intended to include metal clips or other large-area interconnects with a generally rectangular cross-sectional area such as metal ribbons used in semiconductor die packages. Metal clips are typically soldered or glued with electrically conductive adhesive to other structures while metal ribbons are typically ultrasonically bonded. The term 'generally rectangular cross-sectional area' as used herein is intended to mean a cross-sectional area having a rectangular or quasi-rectangular shape as opposed e.g. to a round or oval cross-sectional shape typically associated with bond wire connections.

The inter-die connections described herein can be realized by connecting one end of a metal layer to an electrode of a die, and connecting the opposite end of the metal layer to an electrode of another die in the same package. Either die electrode also can be connected to a lead frame/substrate included in the package to complete the electrical interconnection for that particular die. The separate metal layers connected to the same electrode of a die can be arranged in different planes or spaced apart from each other in the same plane. In each case, one end of both metal layers is connected to the same die electrode either in a stacked or spaced-apart manner.

The inter-die connections described herein provide greater flexibility in die layout and die interconnect placement within the package since at least two separate metal layers are used to connect dies to the same potential in one package. For example, separate metal layers connecting two or more dies to the same potential can be orientated at different angles to allow for greater integration flexibility. In general the inter-die connections described herein provide for a high level of integration and easy 3-D integration of component circuits, improve heat dissipation by providing double-sided cooling, reduce electrical resistance, and increase component reliability due to the use of more secure die contacts.

Figure 1:
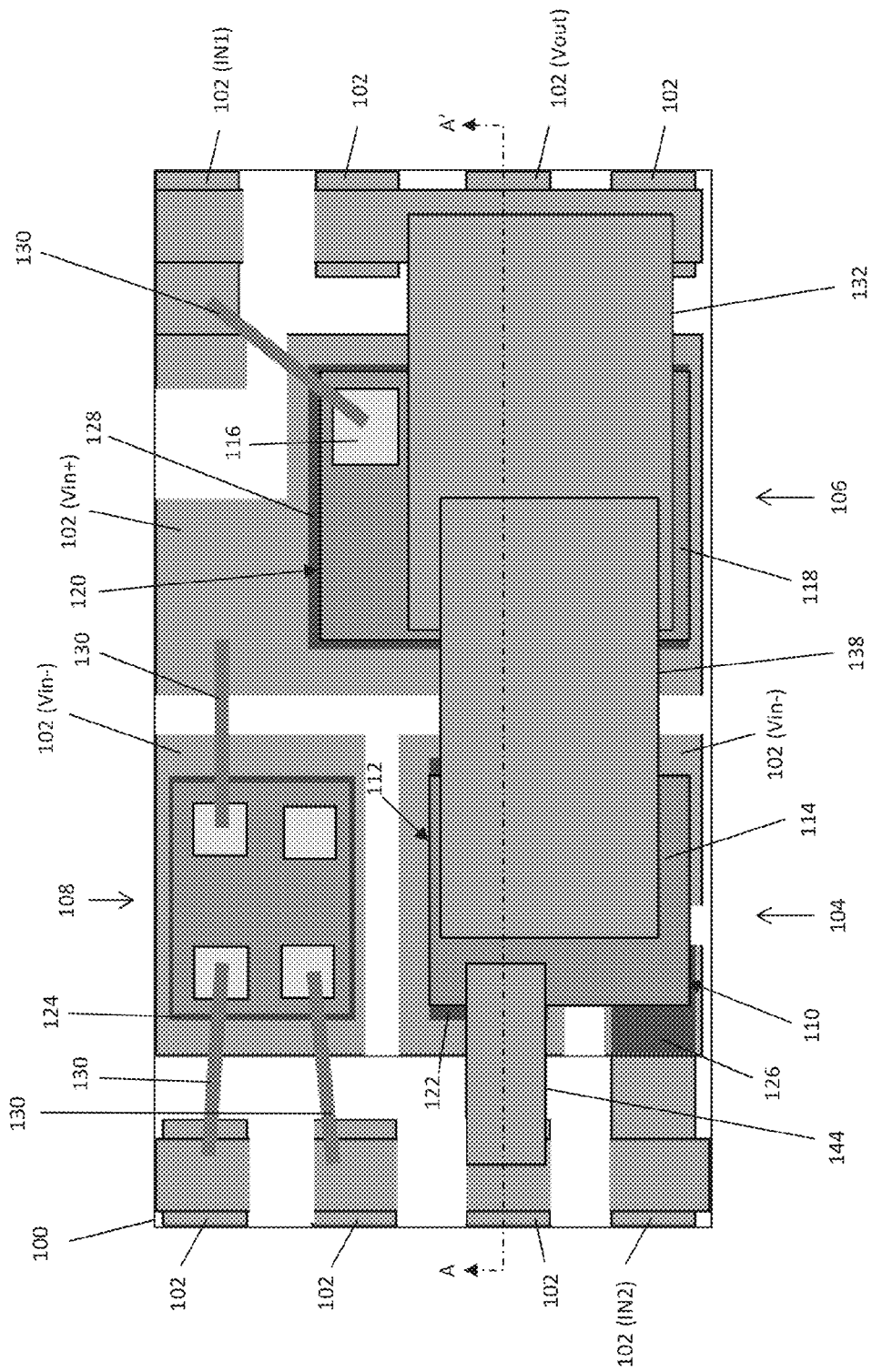
FIG. 1 illustrates a top-down plan view of a multi-die package according to an embodiment.
Figure 2:
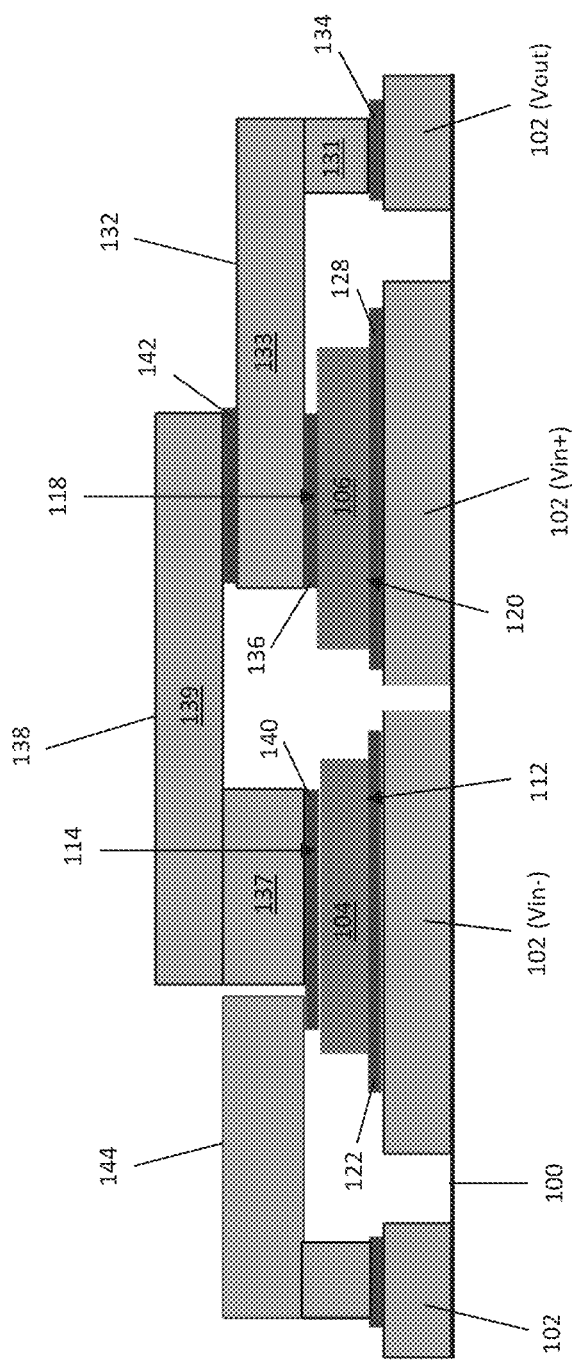
FIG. 2 illustrates a cross-sectional view of the multi-die package of FIG. 1 along the line labeled A-A'.

FIG. 1 illustrates a top down plan view of a multi-die package prior to encapsulation, and FIG. 2 illustrates a cross-sectional view of the package along the line labeled A-A' in FIG. 1. The package includes a substrate 100 with conductive regions 102. In one embodiment, the substrate 100 is a lead frame and the conductive regions 102 are different sections of the lead frame. In another embodiment, the substrate 100 is a circuit board with conductive regions 102. In yet another embodiment, the substrate 100 is an electrically insulating body such as a ceramic material with conductive regions 102 disposed on the body. Still other substrates 100 with conductive regions 102 can be used.

In each case, the conductive regions 102 of the substrate 100 provide points of electrical connection for semiconductor dies included in the package. In the purely exemplary embodiment shown in FIG. 1, two transistor semiconductor dies 104, 106 such as IGBT (insulated gate bipolar transistor), MOSFET (metal-oxide field-effect transistor) or JFET (junction field-effect transistor) or diode dies are included in the package along with a capacitor 108.

Figure 3:
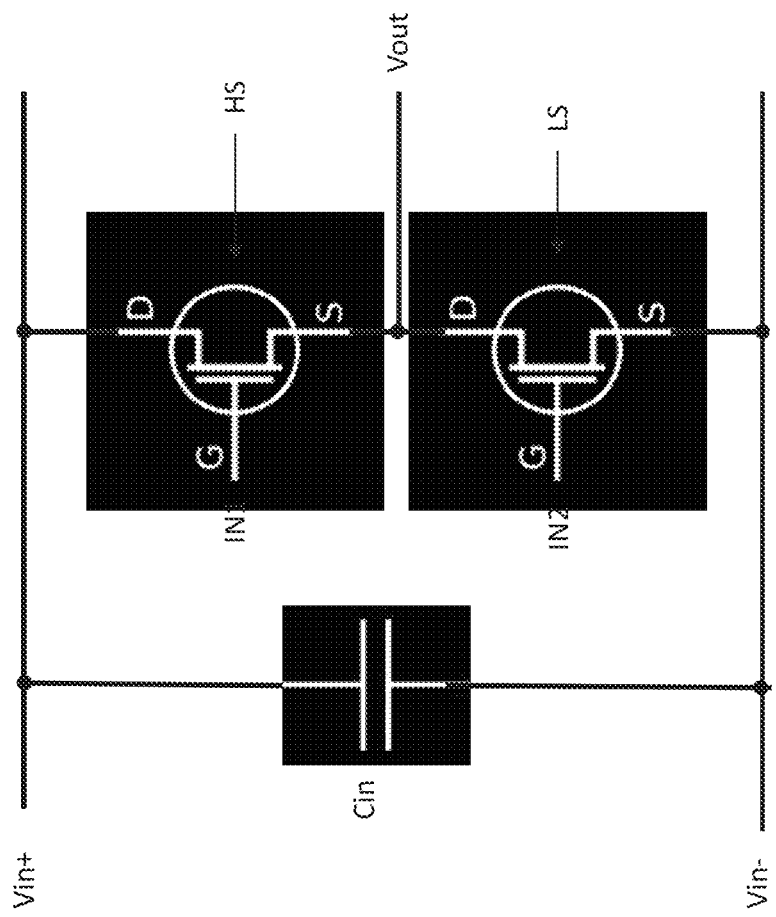
FIG. 3 illustrates an exemplary circuit diagram of a half-bridge converter circuit realized by the components included in the package of FIG. 1.

For ease of explanation and illustration only, the circuit realized by the components included in the package of FIG. 1 is a half-bridge converter circuit as shown in FIG. 3. The half-bridge circuit includes a low-side transistor (LS), a high-side transistor (HS) and an input capacitor (Cin) coupled between the positive input (Vin+) and the negative input (Vin−) of the half-bride circuit. The negative input can be ground in some configurations. The low-side transistor LS corresponds to one of the dies 104 shown in FIGS. 1 and 2, the high-side transistor HS corresponds to the other die 106, and the input capacitor Cin corresponds to the capacitor component 108. In the exemplary circuit diagram shown in FIG. 3, the transistors are MOSFETs each having gate (G), drain (D) and source (S) terminals.

The gate, drain and source terminals of the low-side transistor LS correspond to gate, source and drain electrodes 110, 112, 114 of the low-side transistor die 104 shown in FIG. 1. The gate, drain and source terminals of the high-side transistor HS correspond to gate, source and drain electrodes 116, 118, 120 of the high-side transistor die 106. The drain terminal of the high-side transistor HS is electrically connected to the positive input (Vin+) of the half-bridge circuit. The source terminal of the high-side transistor HS is electrically connected to the drain terminal of the low-side transistor LS to form the output (Vout) of the half-bridge circuit. The source terminal of the low-side transistor LS is electrically connected to the negative input (Vin−). The transistor gates serve as control signal inputs (IN1, IN2). IGBTs could be used instead of MOSFETs where the collector connections of the IGBTs would correspond to the drain connections of the MOSFETs and the emitter connections of the IGBTs would correspond to the source connections of the MOSFETs. In either case the positive input terminal (Vin+), the negative input terminal (Vin−) and the output terminal (Vout) of the half-bridge circuit correspond to different ones of the conductive regions 102 of the substrate 100 shown in FIG. 1. In general the type and number of semiconductor dies included in the package depends on the particular application for which the package is designed, and the inter-die interconnect embodiments described herein can be used in each case.

Each semiconductor die 104, 106 has one or more electrodes on each side of the die 104, 106. For example, the low-side transistor die 104 has a gate electrode 110 and a source electrode 112 on a side of the die 104 facing the substrate 100 and a drain electrode 114 on a side of the die 104 facing away from the substrate 100. In the opposite manner, the high-side transistor die 106 has a drain electrode 120 on a side of the die 106 facing the substrate 100 and a gate electrode 116 and a source electrode 118 on a side of the die 106 facing away from the substrate 100. The low-side transistor die 104 has a so-called 'flip-chip' configuration according to this embodiment. Other die configurations can be used. Described next are the connections to the electrodes 110, 112, 120 at the side of the dies 104, 106 facing the substrate 100.

The source electrode 112 of the low-side transistor die 104 is connected e.g. by solder 122 to a conductive region 102 of the substrate 100 which is electrically connected to the negative input (Vin−) of the half-bridge circuit. The side of the capacitor component 108 facing the substrate 100 is also connected e.g. by solder 124 to a conductive region 102 of the substrate 100 which is also electrically connected to Vin−. The gate electrode 110 of the low-side transistor die 104 is connected e.g. by solder 126 to a conductive region 102 of the substrate 100 which is electrically connected to the gate input of the low-side transistor 104. The drain electrode 120 of the high-side transistor die 106 is connected e.g. by solder 128 to a conductive region 102 of the substrate 100 which is electrically connected to the positive input (Vin+) of the half-bridge circuit. The side of the capacitor component 108 facing away from the substrate 100 is connected e.g. by bond wire 130 to the same conductive region 102 of the substrate 100 as the drain electrode 120 of the high-side transistor die 106. This side of the capacitor component 108 is also connected e.g. by bond wire 130 to another conductive region 102 in the periphery region of the substrate 100. Described next are the connections to the electrodes 114, 116, 118 at the side of the dies 104, 106 facing away from the substrate 100.

A first metal layer 132 with a generally rectangular cross-sectional area extends from the periphery region of the substrate 100 to over the high-side transistor die 106. The first metal layer 132 connects the source electrode 118 of the high-side transistor die 106 to a conductive region 102 in the periphery region of the substrate 100 which is designated as the output (Vout) of the half-bridge circuit. In the embodiment shown in FIGS. 1 and 2, the first metal layer 132 is a metal clip connected at one end by solder 134 to the conductive region 102 of the substrate 100 and connected at the opposing end by solder 136 to the source electrode 118 of the high-side transistor die 106. In other embodiments, the first metal layer 132 is a metal ribbon with a generally rectangular cross-sectional area instead of a metal clip.

A second metal layer 138 separate from the first metal layer 132 also with a generally rectangular cross-sectional area extends over the low-side and high-side transistor dies 104, 106. The second metal layer 138 connects the source electrode 118 of the high-side transistor die 106 to the drain electrode 114 of the low-side transistor die 104. In the embodiment shown in FIGS. 1 and 2, the second metal layer 138 is a metal clip connected at one end by solder 140 to the drain electrode 114 of the low-side transistor die 104 and connected at the opposing end by solder 142 to the end of the first metal layer 132 which is connected to the source electrode 118 of the high-side transistor die 106. In other embodiments, the second metal layer 138 is a metal ribbon with a generally rectangular cross-sectional area instead of a metal clip. A third metal layer 144 separate from the first and second metal layers 132, 138 and also with a generally rectangular cross-sectional area connects the drain electrode 114 of the low-side transistor die 104 to a conductive region 102 in the periphery region of the substrate 100.

According to the embodiment illustrated in FIGS. 1 and 2, the first metal layer 132 has a minor section 131 connected (via solder 134) at one end to a conductive region 102 in the periphery region of the substrate 100. The minor section 131 of the first metal layer 132 extends away from the substrate 100. The first metal layer 132 also has a major section 133 extending from the opposing end of the minor section 131 to the source electrode 118 of the high-side transistor die 106. The second metal layer 138 similarly has a minor section 137 connected (via solder 140) at one end to the drain electrode 114 of the low-side transistor die 104. The minor section 137 of the second metal layer 138 extends away from the low-side transistor die 104. The second metal layer 138 also has a major section 139 extending from the opposing end of the minor section 137 to the side of the first metal layer 132 facing away from the high-side transistor die 106. In one embodiment, the minor and major sections 131, 133, 137, 139 of the first and/or second metal layers 132, 138 are of a single continuous construction. The major sections 133, 139 of the first and second metal layers 132, 138 can each have a thickness of at least 150 μm in some embodiments, or a thickness of at least 200 μm in other embodiments.

Figure 4:
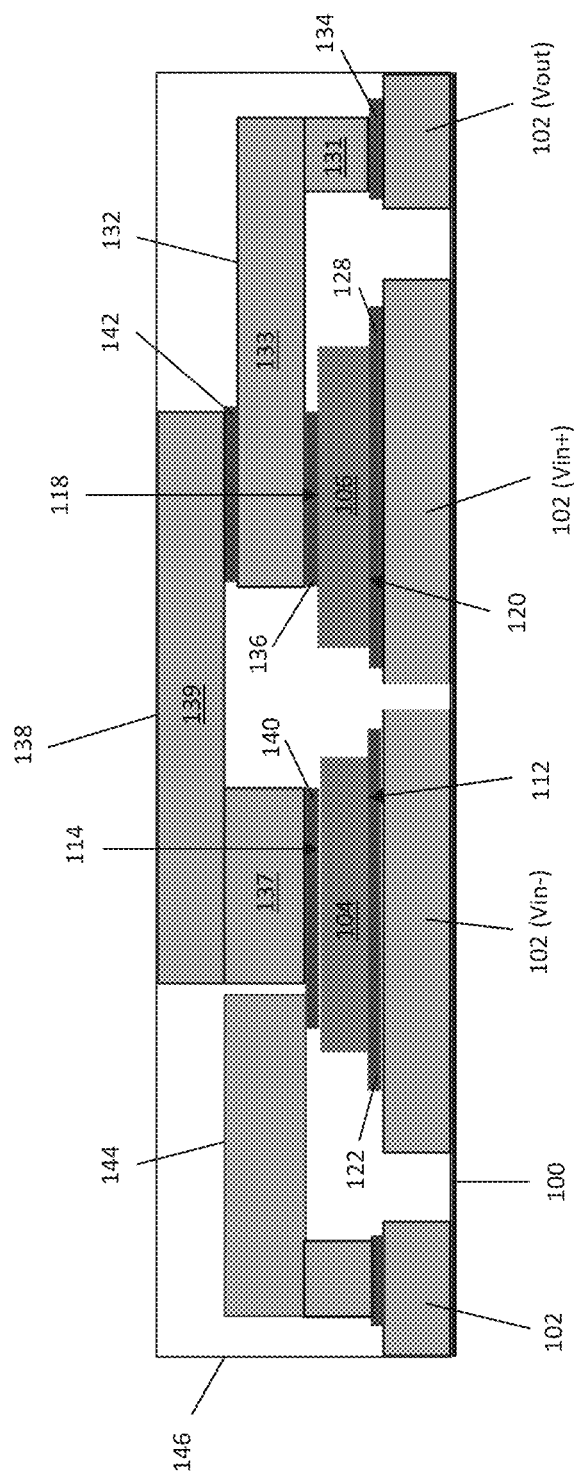
FIG. 4 illustrates a cross-sectional view of the multi-die package of FIG. 1 along the line labeled A-A' post encapsulation.

FIG. 4 illustrates a cross-sectional view of the multi-die package shown in FIG. 1 along the line labeled A-A', after an encapsulant 146 is applied to the package. The substrate 100, dies 104, 106, capacitor 108 and metal layers 132, 134 are encapsulated by the encapsulant 146. The multi-die package can be a leadless package as shown in FIGS. 1, 2, and 4 or have leads.

In each case and according to the embodiment illustrated in FIGS. 1, 2 and 4, the first metal layer 132 has a first side connected to the source electrode 118 of the high-side transistor die 106 and a second side opposing the first side connected to the second metal layer 138. The first metal layer 132 extends in a first plane and the second metal layer 138 extends in parallel with the first metal layer 132 in a second plane different than the first plane according to this embodiment.

Figure 5:
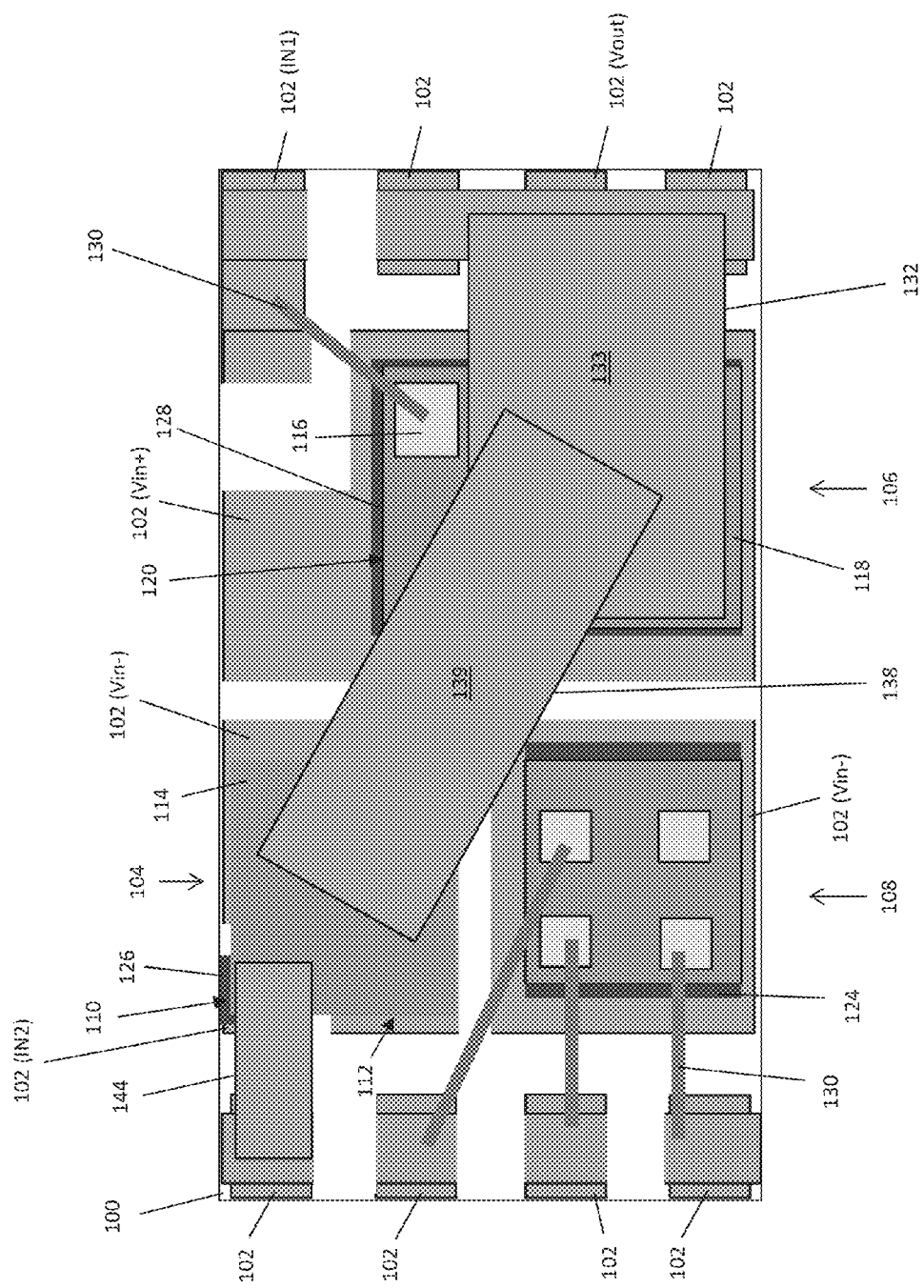
FIG. 5 illustrates a top-down plan view of a multi-die package according to another embodiment.

FIG. 5 illustrates a top-down plan view of another multi-die package which is similar to the embodiment shown in FIG. 1, however, the second metal layer 138 extends from the first metal layer 132 at an angle (θ) between 5° and 90°. In one embodiment, θ is between 30° and 45°. In another embodiment, θ is about 90°. Also the position of the capacitor component 108 and the low-side transistor die 104 are switched in FIG. 5 as compared to FIG. 1, illustrating another advantage of using more than one metal layer 132, 138 to connect different dies 104, 106 to the same potential (e.g. Vout). The position of the capacitor component 108 and the low-side transistor die 140 could not be switched if a single metal layer instead were used to connect the source electrode 118 of the high-side transistor die 106 and the drain electrode 114 of the low-side transistor die 104 to the same potential (e.g. Vout).

Figure 6:
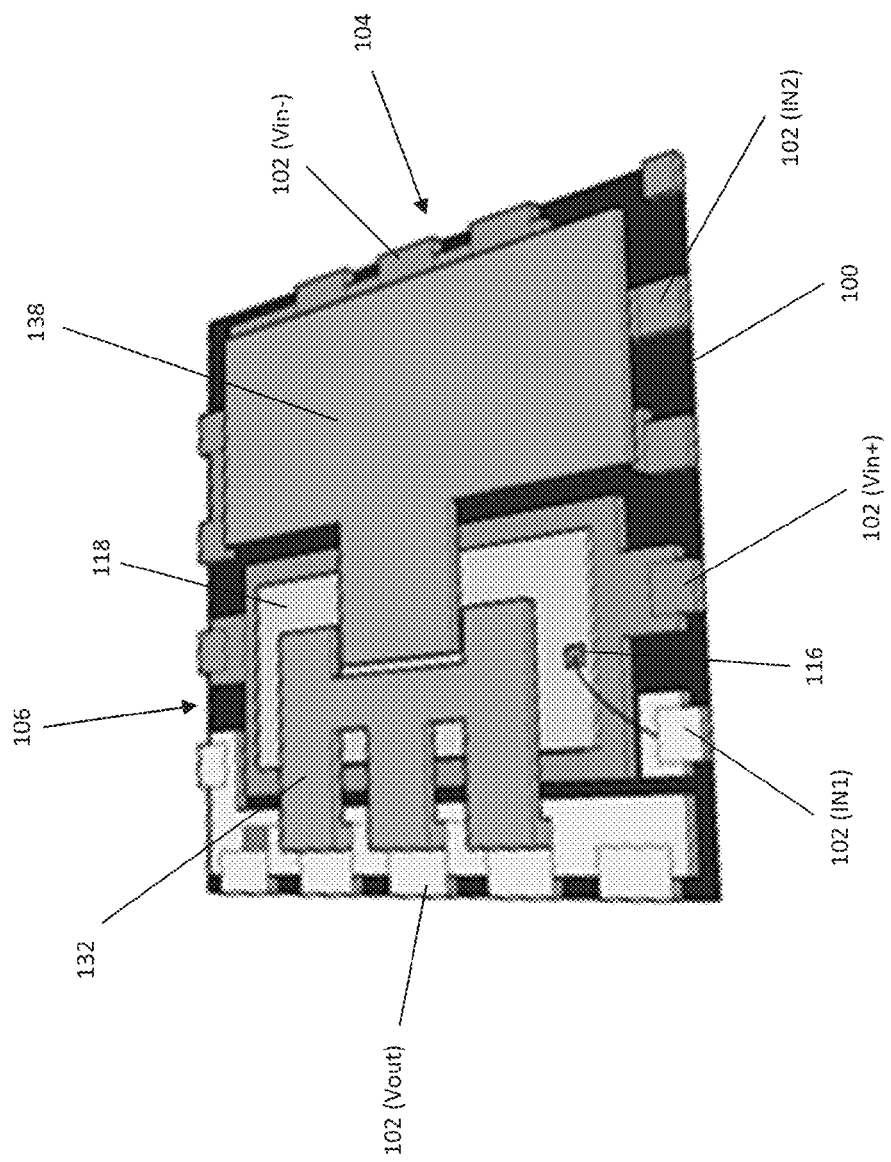
FIG. 6 illustrates a top-down plan view of a multi-die package according to yet another embodiment.

FIG. 6 illustrates a top-down plan view of yet another multi-die package which is similar to the embodiment shown in FIG. 1, however, the first and second metal layers 132, 138 extend in the same plane and are spaced apart from each other in that plane. According to this embodiment the first metal layer 132 is connected to a first part of the source electrode 118 of the high-side transistor die 106 and the second metal layer 138 is connected to a second, different part of the same source electrode 118. Also according to this embodiment, the second metal layer 138 can be a single body having a uniform planar construction.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A multi-die package, comprising:
a substrate having a plurality of conductive regions;
a first semiconductor die having first and second opposing sides, a first electrode at the first side connected to a first one of the conductive regions, and a second electrode at the second side;
a second semiconductor die having first and second opposing sides, a first electrode at the first side connected to a second one of the conductive regions, and a second electrode at the second side;
a first metal layer extending from a periphery region of the substrate to over the first die, the first metal layer having a generally rectangular cross-sectional area and connecting one of the conductive regions in the periphery region of the substrate to the second electrode of the first die; and
a second metal layer separate from the first metal layer and extending over the first and second dies, the second metal layer having a generally rectangular cross-sectional area and connecting the second electrode of the first die to the second electrode of the second die.

2. The multi-die package according to claim 1, wherein the first metal layer has a first side connected to the second electrode of the first die and a second side opposing the first side connected to the second metal layer.

3. The multi-die package according to claim 1, wherein the first metal layer is connected to a first part of the second electrode of the first die and the second metal layer is connected to a second part of the second electrode of the first die different than the first part.

4. The multi-die package according to claim 1, wherein the first metal layer extends in a plane and the second metal layer is spaced apart from the first metal layer in the same plane.

5. The multi-die package according to claim 1, wherein the first metal layer extends in a first plane and the second metal layer extends in parallel with the first metal layer in a second plane different than the first plane.

6. The multi-die package according to claim 5, wherein the second metal layer extends from the first metal layer at an angle between 5° and 90°.

7. The multi-die package according to claim 6, wherein the second metal layer extends from the first metal layer at an angle between 30° and 45°.

8. The multi-die package according to claim 6, wherein the second metal layer extends from the first metal layer at an angle of about 90°.

9. The multi-die package according to claim 1, wherein the first metal layer comprises a minor section connected to one of the conductive regions in the periphery region of the substrate and extending away from the substrate, and a major section extending from the minor section to the second electrode of the first die.

10. The multi-die package according to claim 9, wherein the minor and major sections of the first metal layer are of a single continuous construction.

11. The multi-die package according to claim 1, wherein the second metal layer comprises a minor section connected to the second electrode of the second die and extending away from the second die, and a major section extending from the minor section to a side of the first metal layer facing away from the first die.

12. The multi-die package according to claim 11, wherein the minor and major sections of the second metal layer are of a single continuous construction.

13. The multi-die package according to claim 1, wherein the second metal layer is a single body having a uniform planar construction.

14. The multi-die package according to claim 1, wherein the first metal layer is a metal clip having a first end soldered to one of the conductive regions in the periphery region of the substrate and a second end soldered to the second electrode of the first die, and wherein the second metal layer is a metal clip having a first end soldered to the second electrode of the first die and a second end soldered to the second electrode of the second die.

15. The multi-die package according to claim 1, further comprising an encapsulant encapsulating the substrate, the first die, the second die, first metal layer, and the second metal layer.

16. The multi-die package according to claim 1, wherein:
the first die is a low-side transistor of a half-bridge converter circuit and the second die is a high-side transistor of a half-bridge converter circuit;
the first electrode of the first die is a source electrode of the low-side transistor;
the second electrode of the first die is a drain electrode of the low-side transistor;
the first electrode of the second die is a drain electrode of the high-side transistor;
the second electrode of the second die is a source electrode of the high-side transistor;
the first metal layer connects the conductive region of the substrate designated as an output of the half-bridge converter circuit to the drain electrode of the low-side transistor; and
the second metal layer connects the drain electrode of the low-side transistor to the source electrode of the high-side transistor.

17. A method of manufacturing a multi-die package, the method comprising:
providing a substrate having a plurality of conductive regions;
connecting a first electrode at a first side of a first semiconductor die to a first one of the conductive regions, the first die having a second electrode at an opposing second side of the first die;
connecting a first electrode at a first side of a second semiconductor die to a second one of the conductive regions, the second die having a second electrode at an opposing second side of the second die;
connecting one of the conductive regions in a periphery region of the substrate to the second electrode of the first die via a first metal layer which extends from the periphery region of the substrate to over the first die and has a generally rectangular cross-sectional area; and
connecting the second electrode of the first die to the second electrode of the second die via a second metal layer which is separate from the first metal layer, extends over the first and second dies and has a generally rectangular cross-sectional area.

18. The method according to claim 17, wherein connecting one of the conductive regions in the periphery region of the substrate to the second electrode of the first die comprises:
connecting a minor section of the first metal layer to the conductive region in the periphery region of the substrate, the minor section extending away from the substrate; and
connecting a major section of the first metal to the second electrode of the first die, the minor and major sections of the first metal layer being contiguous.

19. The method according to claim 17, wherein connecting the second electrode of the first die to the second electrode of the second die via the second metal layer comprises:
connecting a first side of the first metal layer to the second electrode of the first die; and
connecting an opposing second side of the first metal layer to the second metal layer.

20. The method according to claim 17, wherein connecting the second electrode of the first die to the second electrode of the second die via the second metal layer comprises:
connecting the first metal layer to a first part of the second electrode of the first die; and
connecting the second metal layer to a second part of the second electrode of the first die different than the first part.

21. The method according to claim 17, wherein the first metal layer is a first metal clip and the second metal layer is a second metal clip, and wherein connecting the second electrode of the first die to the second electrode of the second die via the second metal layer comprises:
soldering a first end of the first metal clip to one of the conductive regions in the periphery region of the substrate;
soldering a second end of the first metal clip to the second electrode of the first die;
soldering a first end of the second metal clip to the second electrode of the first die; and
soldering a second end of the second metal clip to the second electrode of the second die.

* * * * *